United States Patent
Westbrook et al.

(10) Patent No.: US 6,203,967 B1
(45) Date of Patent: Mar. 20, 2001

(54) METHOD FOR CONTROLLING STRESS IN THIN FILM LAYERS DEPOSITED OVER A HIGH DENSITY INTERCONNECT COMMON CIRCUIT BASE

(75) Inventors: Scott M. Westbrook, Los Altos; Jan I. Strandberg, Cupertino, both of CA (US)

(73) Assignee: Kulicke & Soffa Holdings, Inc., Willow Grove, PA (US)

(*) Notice: Subject to any disclaimer, the term of this patent is extended or adjusted under 35 U.S.C. 154(b) by 0 days.

(21) Appl. No.: 09/127,579

(22) Filed: Jul. 31, 1998

(51) Int. Cl.[7] .......................... G03C 5/00; H01L 23/538; H05K 3/46
(52) U.S. Cl. .............................................. 430/313
(58) Field of Search ................................... 430/313, 311; 174/250, 261; 428/901; 257/720

(56) References Cited

U.S. PATENT DOCUMENTS

| | | | |
|---|---|---|---|
| 4,496,793 | 1/1985 | Hanson et al. | 174/68.5 |
| 4,654,248 | 3/1987 | Mohammed | 428/137 |
| 4,695,868 | 9/1987 | Fisher | 357/68 |
| 5,219,639 | 6/1993 | Sugawara et al. | 428/209 |
| 5,278,727 | 1/1994 | Westbrook et al. | 361/792 |
| 5,338,975 | * 8/1994 | Cole, Jr. et al. | 257/750 |
| 5,483,101 | 1/1996 | Shimoto et al. | 257/701 |

FOREIGN PATENT DOCUMENTS 90 16 266   3/1991   (DE) ................................ H05K/3/46

OTHER PUBLICATIONS

"Formation of Surface Laminar Circuit on Printed Circuit Board with Plated Through Holes," *IBM Technical Disclosure Bulletin*, vol. 36, No. 10, p. 511 (Oct. 1993).

* cited by examiner

*Primary Examiner*—Shean C. Wu
(74) *Attorney, Agent, or Firm*—Townsend and Townsend and Crew LLP (57) ABSTRACT

A method for forming a high density interconnect printed wiring board substrate that has a first patterned conductive layer formed over an upper surface of the substrate that includes multiple conductive lines having edges that define the boundaries of the conductive lines and a dielectric layer formed over the patterned conductive layer and between the edges of the conductive lines. The method includes forming a thin film conductive layer over the dielectric layer, and patterning the thin film conductive layer such that, after the patterning step, the thin film conductive layer overlies each of the edges of the conductive lines. In a preferred embodiment, the thin film conductive layer is patterned such that, after the patterning step, the layer overlies the edges of the conductive lines by at least 10 microns. In another aspect of the invention, a method for strengthening thin film build-up layers deposited over a high density interconnect common circuit base is taught. According to this aspect, a photo-definable thin film dielectric layer having a coefficient of expansion of less than about 10% is formed over a patterned conductive layer, and a thin film conductive layer is formed over the photo-definable thin film dielectric layer. The thin film conductive layer is then patterned to include a plurality of signal lines and a plurality of thieving lines with the thieving lines being placed between nonuniformly spaced signal lines to provide a substantially uniform combined pattern of signal lines and thieving lines.

18 Claims, 6 Drawing Sheets

METHOD FOR CONTROLLING STRESS IN THIN FILM LAYERS DEPOSITED OVER A HIGH DENSITY INTERCONNECT COMMON CIRCUIT BASE

BACKGROUND OF THE INVENTION

The present invention relates to the use of thin film deposition technology to create high density interconnects on a conventional printed wiring board substrate. More specifically, the present invention pertains to a method for reducing the effects of accumulated stress at the boundaries of conductive and insulative layers. The method of the present invention can be used with or without conventional build-up layers (e.g., a planarized dielectric layer deposited over the upper surface of a completed printed wiring board substrate, typically by the substrate manufacturer, that has a corresponding dielectric layer deposited over the lower surface of the substrate to counterbalance the stress of the upper build-up layer) and is useful for high density integrated circuit packaging of single chip, multi-chip, and support components such as resistors and capacitors. The method of the present invention is also useful for creating interconnections on high density daughter boards that carry packaged devices.

The semiconductor industry continues to produce integrated circuits of increasing complexity and increasing density. The increased complexity of some of these integrated circuits has in turn resulted in an increased number of input/output pads on the circuit chips. At the same time, the increased density of the chips has driven the input/output pad pitch downward. The combination of these two trends has been a significant increase in the connector pin wiring density needed to connect the chips to packages that interface with the outside world and interconnect the chips to other integrated circuit devices.

A number of different technologies have been developed to interconnect multiple integrated circuits and related components. One such technology, based on traditional printed wiring board (PWB) technology that found wide use during the period in which integrated circuits were packaged in surface mount devices like quad flat packs (QFPs), is often referred to as MCM-L or laminate MCM technology. MCM-L technology typically uses copper and insulating dielectric material sub-laminates as building blocks to create the required interconnect structures. The process of forming a copper conductive pattern on the sub-laminate in MCM-L technology typically includes forming a dry film of photo resist over the copper layer, patterning and developing the photo resist to from an appropriate mask and selectively etching away the unwanted copper thereby leaving the desired patterned conductive layer.

Substrates used in MCM-L technology can be manufactured in large area panels providing efficiencies that lower the costs of production. Interconnect solutions using this technology generally have relatively good performance characteristics because of the copper and low dielectric constant (e.g. less than or equal to 4.0) employed. The printed wiring board industry, however, has not kept pace with the advances in semiconductor manufacturing in terms of pad density. As a result, there is a capability gap between semiconductor manufacturers and interconnect printed wiring board manufactures.

In some applications, two or more pieces of laminate are laminated together to form a final structure. Interconnection between the laminated layers can be provided by through hole mechanical drilling, followed by plating. The drilling process is relatively slow and expensive and can require a large amount of board space. As the number of interconnect pads increases, an increased number of signal layers is often used to form the interconnect structure. Because of these limitations, the conventional printed wiring board technology needs to go to a large umber of metal layers (e.g. greater than eight layers) for some of the applications in high density integrated circuit packaging and daughter board fabrication. Utilizing a large number of layers in this context generally increases cost and decreases electrical performance. Also, the pad size limits the wiring density on any given layer with this technology. Thus, MCM-L technology, while useful for some applications, is not capable of providing the connection density required in other applications.

To improve the interconnect density of MCM-L technology, an advanced printed wiring board technology approach called build-up multi-layer has been developed. In this technology a traditional printed wiring board core is the starting point. Standard drilling and plating techniques are used to form plated through holes in the core. From the basic core this conventional build-up approach has many variations. Typically a dielectric layer approximately 50 microns thick is laminated to both the top and bottom major surfaces of the conventionally fabricated printed wiring board substrate. Vias are made in the build-up layer by laser ablation, photo mask/plasma etch, or other known methods. An electroless seeding step is then done prior to a panel plating step that metalizes both the upper and lower surfaces. Subsequent masking and wet etching steps then define a desired conductive pattern over the laminated dielectric layers.

This technology offers a large improvement in terms of density over MCM-L technology without build-up layers; however, such build-up boards require multiple layers in order to meet the developing high density packaging and daughter board requirements. Thus this technology still has limitations.

Another conventional approach used to package high density input/output uses thick film (screen printing) over cofired ceramic substrates. This technology is sometimes referred to as MCM-C, cofired ceramic MCM and thick film MCM technology. Basically, MCM-C technology involves rolling a ceramic mix into sheets, drying the sheets, punching vias, screening the rolled sheets with a metal paste representing the trace pattern on the surface of the ceramic, stacking and laminating all the layers together, then cofiring at a high temperature (e.g. greater than 850 degrees C) to achieve the desired interconnections.

MCM-C construction has found extensive use in high density and high reliability products where the robustness of the high density interconnect package outweighs the cost considerations. The ability to create a hermetic seal in the ceramic improves the ability to withstand environments not tolerable to conventional printed wiring board technology. While this technology is capable of high density packaging applications (e.g. greater than 1000 pads), it is also very costly. Additionally, performance characteristics, such as signal propagation time, are impacted due to the relatively high dielectric constant (e.g. between 5.0 and 9.0) of the ceramic material. MCM-C technology provides higher connection density than MCM-L technology, but is not capable of providing the connection density required for some of today's high density interconnect applications.

A third approach which the high density interconnect and packaging industry has moved toward to address these high density interconnect applications uses thin film MCM technology and is sometimes referred to as MCM-D or MCM deposition technology. Such MCM-D technology includes forming and patterning thin film conductive traces over a common circuit base.

In some applications, MCM-D technology utilizes a low cost, large surface area printed wiring board structure, with or without the use of conventional build-up multi-layers on the printed wiring board, as the common base and as a starting point to meet the high density and low cost interconnect requirements. Such large substrates may have a surface area of 40 cm by 40 cm or more, thereby providing efficiencies that lower the costs of production. This combination of existing conventional high volume printed wiring board technology and advanced thin film deposition technology represents a significant economic advantage and density improvement as compared to the previously discussed MCM-L and MCM-C technologies.

One significant feature of MCM-D technology is that it creates a high interconnect density substrate using thin film processes on only one side of the common circuit base. The high density interconnects are formed by depositing alternating conducting and insulating thin film layers. The total thickness of several of these deposited layers is less than the thickness of a single conventional build-up layer. This eliminates the need for balancing the build-up layers on both top and bottom to prevent warpage of the substrate.

The MCM-D process involves first laying down a layer of an insulating dielectric on the top surface of a common circuit base, depositing a conductive material over the dielectric layer, creating a circuit pattern in the conductive material, then depositing the next insulating and conductive layers. The various layers so created are connected through vias constructed using a variety of known techniques such as wet chemical etch, photo expose and develop or laser ablation. In this way a three dimensional deposited laminated structure is achieved enabling high density interconnect patterns to be fabricated in small physical areas.

Despite the definite advantages of MCM-D technology, there are potential problems that may result in failure modes and performance limitations if the thin film formation process is not properly implemented. One important aspect of the implementation of deposited thin film layers on the surface of printed wiring board substrates is the control of mechanical stresses generated by both processing and operation. Key to control of the these stresses is recognizing the differences in thermal characteristics of the materials in both the substrate and the thin film build-up layers and then to provide a fabrication method and high density deposited build-up layer structure capable of tolerating the mechanical stresses.

The differences in the coefficients of thermal expansion (CTE) between the dielectric materials of choice (e.g., a CTE of between about 50 to 70 parts per million) and metal materials of choice (e.g., a CTE between about 16 to 17 parts per million) in some MCM-D applications generate stresses that can be the source of cracking and failure. While the stresses cannot altogether be eliminated, it is important, through proper design of the thin film structure, to control the stresses to eliminate or at least minimize any adverse affects that could otherwise be created by such stresses.

SUMMARY OF THE INVENTION

The present invention provides a solution to the problem of controlling such mechanical stresses generated by differences in coefficients of thermal expansion between the dielectric materials and metal materials of thin film deposited layers of high density interconnects. In doing so, the invention enables the minimization of cracking due to these stresses and does so in an economically attractive process that is able to meet the needs of today's high density interconnect applications.

According to the method of the present invention, a design process is used which creates a structure that significantly increases the mass of metal in the initial deposited thin film build-up conductive layer that is deposited over the relatively coarse metal features of the underlying surface of the printed wiring board substrate. The increase in the mass of metal is accomplished by the use of a metal grounding plane as the initial conductive layer. This metal grounding plane extends across almost the entire surface of the printed wiring bound substrate with the primary exception being openings having islands within them that allow signals to pass through the ground plane layer to conductive layers above and below the plane. Thus, effectively, metal which would normally be etched away in the process step that forms the conductive pattern in the initial thin film conductive layer is instead kept thereby increasing the metal mass of this initial layer. By increasing the metal mass of the initially deposited thin film conductive layer, the layer is mechanically strengthened, minimizing the effects of any stresses generated. This reinforcing member also provides a mechanical shield for subsequently deposited thin film layers by shadowing the underlying larger printed wiring board substrate features. Such shadowing prevents the propagation of cracks to overlying layers. A second thin film metal layer (and in some embodiments a third or more thin film metal layer) is deposited over the grounding plane to form the desired signal pattern.

In one embodiment, the method of the present invention forms an increased strength thin film interconnect structure over a high density interconnect printed wiring board substrate that has a first patterned conductive layer formed over an upper surface of the substrate. The first patterned conductive layer includes multiple conductive lines having edges that define the boundaries of the conductive lines. The printed wiring board substrate also includes a dielectric layer, either a thin film dielectric layer or a conventional build-up dielectric layer, formed over the patterned conductive layer and between the edges of the conductive lines. This embodiment of the method of the present invention increases the strength of a thin film interconnect structure subsequently formed over such a substrate by forming a thin film conductive layer over the dielectric layer, and patterning the thin film conductive layer such that, after the patterning step, the thin film conductive layer overlies each of the edges of the conductive lines. In a preferred embodiment, the thin film conductive layer is patterned such that, after the patterning step, the layer overlies the edges of the conductive lines by at least 10 microns.

In another embodiment of the present invention, a method for strengthening thin film dielectric layers deposited over a high density interconnect common circuit base is taught. In this embodiment, a photo-definable thin film dielectric layer having a coefficient of expansion of less than about 10% is formed over a patterned conductive layer, and a thin film conductive layer is formed over the photo-definable thin film dielectric layer. The thin film conductive layer is then patterned to include a plurality of signal lines and a plurality of thieving lines with the thieving lines being placed between nonuniformly spaced signal lines to provide a substantially uniform combined pattern of signal lines and thieving lines. The thieving lines have a rebar-effect on the thin film dielectric layer reinforcing the layer and thus increasing its ability to withstand the mechanical stresses the layer is subjected to during subsequent fabrication steps and during operation.

In a preferred embodiment of the apparatus of the present invention, the invention includes a high density interconnect printed wiring board substrate having a first patterned conductive layer formed over an upper surface of the substrate. The first patterned conductive layer includes a plurality of conductive lines that have edges defining boundaries of the conductive lines. A planarizing dielectric layer is formed over the first patterned conductive layer and between the edges of the conductive lines, and a thin film grounding plane layer is formed over the planarizing dielectric layer.

The thin film grounding plane layer overlies the edges of the conductive lines forming a shield that prevents any cracks that form around the edges of the conductive lines from propagating up above the grounding plane layer.

In an even more preferred version of this embodiment of the apparatus of the present invention, a thin film dielectric layer that has a coefficient of expansion of less than about 10% is formed over the thin film grounding plane layer, and a thin film signal layer is formed over the thin film dielectric layer. The thin film signal layer includes multiple signal lines and multiple thieving lines such that the thieving lines are placed between nonuniformly spaced signal lines to provide a substantially uniform combined pattern of signal lines and thieving lines.

These and other embodiments of the present invention, as well as its advantages and features, are discussed in more detail in conjunction with the text below and attached figures.

DETAILED DESCRIPTION OF PREFERRED EMBODIMENTS

Figure 1A:
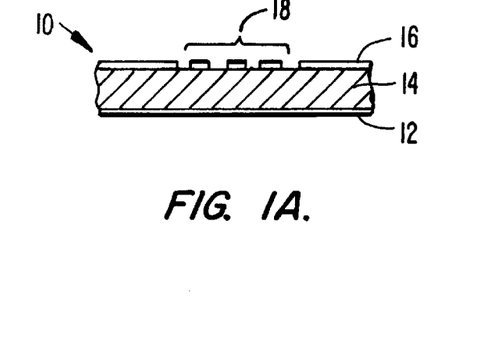
FIG. 1A is a simplified cross section of a conventional single layer printed wiring board substrate.

FIG. 1A is a simplified cross-sectional view of a high density laminated printed wiring board substrate 10. The laminated substrate is formed from a single layer of insulating material 14 such as NEMA FR4 or FR5 epoxy resin and has copper sheets 12 and 16 laminated to its upper and lower surfaces, respectively. A desired conductor pattern 18 is transferred to the copper, for example, by photolithography, then the substrate is placed in a wet chemical etch to remove the unwanted copper, leaving the desired circuit pattern. Several of these sub-laminates with the circuit patterns can be laminated together to form a multi layer printed wiring substrate as shown in FIG. 1B.

Figure 1B:
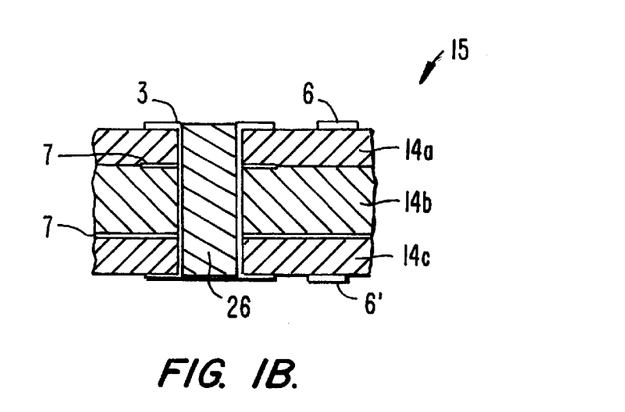
FIG. 1B is a simplified cross-sectional view of a conventional four-layer printed wiring board substrate with a plated through hole.

FIG. 1B is a simplified cross-sectional view of a four-layer printed wiring board substrate 15 which can make use of the present invention. Substrate 15 includes three sub-laminate substrate layers 14a, 14b and 14c. Layer 14b has upper and lower conductive layers 7 and 7', while layer 14a includes an upper conductive layer 6 and layer 14c includes a lower conductive layer 6'. Internal conductive layers 7 and 7' are used for power and ground planes and to provide stiffness. Plated through holes (typically filled with material 26, for example, an insulative or a conductive epoxy) form connections between the conductive layers on the upper and lower surfaces of substrate 15 while buried through vias (not shown) form connections to and between internal layers 7 and 7'. Four-layer substrates, such as substrate 15 just described with conductive layers 7, 7', 6 and 6', can be purchased from substrate manufactures such as International Business Machines Corporation (IBM) and MicroVia Corporation.

Figure 2:
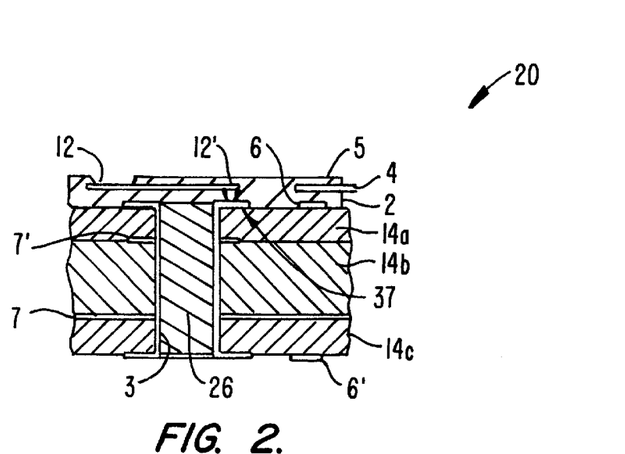
FIG. 2 is a simplified cross-sectional view of a conventional four-layer printed wiring board substrate with a single metalized build-up layer.

Shown in FIG. 2 is a typical high density interconnect structure 20 formed using MCM-D technology over a four-layer printed wiring substrate similar to substrate 15 in FIG. 1B. The high density interconnect structure includes a dielectric planarization layer 2 (either a conventional build-up layer or a thin film layer), a thin film metalization layer 4 (e.g., a chrome/copper stacked layer) 4, and a thin film dielectric passivation layer 5. It is important to note that the thicknesses of the various layers shown in FIG. 2 is not drawn to scale. In a typical, exemplary application, metalization layers 7 and 7' are about 35 microns thick and metalization layers 6 and 6' are about 20 microns thick. In contrast, and in the same exemplary application, the planarization dielectric layer 2 is 45 to 50 microns thick, the thin film deposited metalization layer 4 is about 5 microns thick, and the thin film deposited passivation layer 5 is 10 to 12 microns thick. A person of ordinary skill in the art will realize that the actual thicknesses of each of the layers shown in FIG. 2 may vary.

Interconnects, or vias, 12' are formed between metal features 6 and 4 by photo expose and develop cycles, laser ablation or plasma etch methods depending on the dielectric material used. Contact pads 12 in the top of the passivation layer 5 provide the high density solder connection pads for an integrated circuit device that can be electrically connected to substrate 20 by, for example, wire bonding or flip chip techniques as understood by a person of ordinary skill in the art. Electrical connections are made through filled plated through holes 3, which may or may not be metal capped and which are connected to pads 37, to provide the low density solder connections pads that interface to the next level on the lower surface of four-layer substrate 20.

As was discussed in the Background of the Invention above, thin film layers formed over laminated printed wiring boards substrates, such the substrate shown in FIG. 2, are subject to mechanical stresses. There are a number of sources of these stresses, including physical handling and thermal changes that occur during operation and during the fabrication process. The stresses associated with physical handling can be substantially eliminated through proper design of processes, operator training, and proper fixture design. Thermal stresses, however, are related to unequal expansion of the various layers as a result of differing thermal coefficients of expansion. This stress tends to focus where a metal feature is surrounded by relatively large dielectric areas, creating the possibility that a fracture of the dielectric may occur.

The ability of a material to withstand such stresses can be expressed as the material's elongation percentage, i.e., the amount the material may stretch before cracking. Certain materials used in some thin film interconnect structures have a relatively high elongation percentage and are thus less sensitive to these mechanical stresses. For example, polyimide films typically have a elongation percentage of about 30% and thus are significantly less susceptible to these stresses than some other films. While polyimide layers find uses in a number of commercially available MCM-D applications, the films are less than ideal for other applications. For example, the preferred embodiment of the present invention uses photo-definable dielectric layers as layers 2 and 5 in FIG. 2. Polyimide materials are not photo-definable and are thus not able to be used in the preferred embodiment of the present invention. Instead, the invention preferably uses a photo-definable material such as Nippon Steel Chemical V-259PA (hereinafter "Nippon Steel") or Ciba Probimer. Each of these materials has an elongation percentage significantly lower than 30% and usually lower than 10%. In fact, Nippon Steel has a elongation percentage of about 2.3%.

Thus, the present inventors have determined that controlling mechanical stresses when using materials with relatively low elongation percentages in a thin film interconnect printed wiring board substrate can be critical to the fabrication of a properly functioning substrate. To this end, the present inventors have developed two separate, yet combinable, approaches to strengthen and reinforce deposited thin film dielectric layers against such stresses and to reduce the stresses.

Figure 3A:
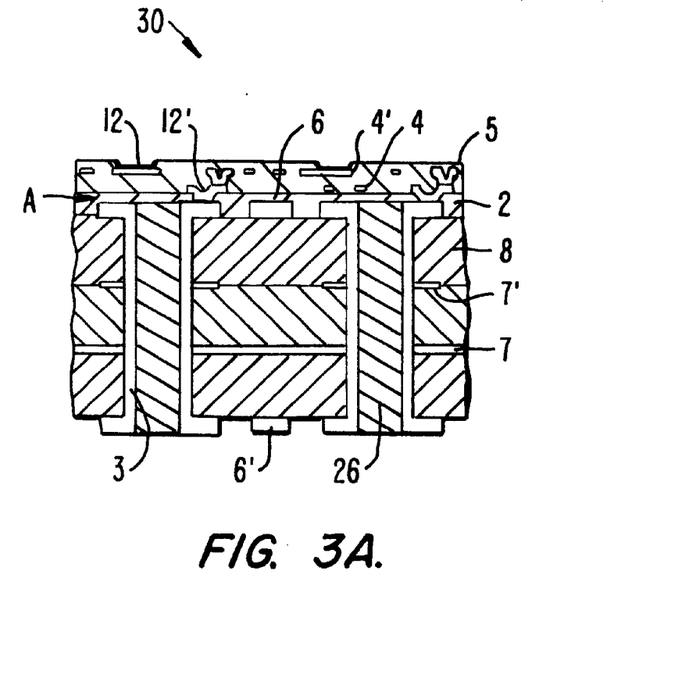
FIG. 3A is a simplified cross-sectional view of two thin film conductive layers formed over a four-layer printed wiring board substrate without the benefit of the present invention.
Figure 3B:
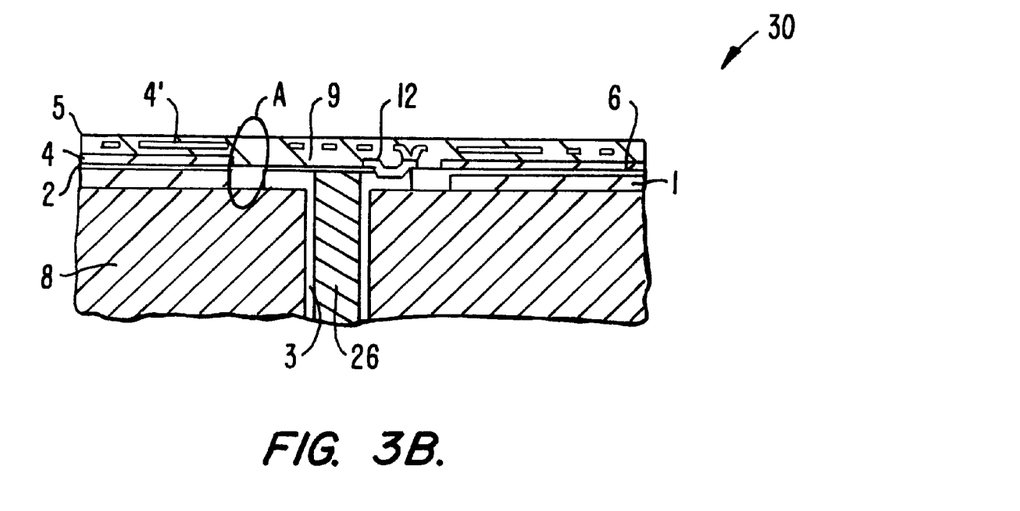
FIG. 3B is a more detailed cross-sectional view of the structure shown in FIG. 3A.
Figure 4A:
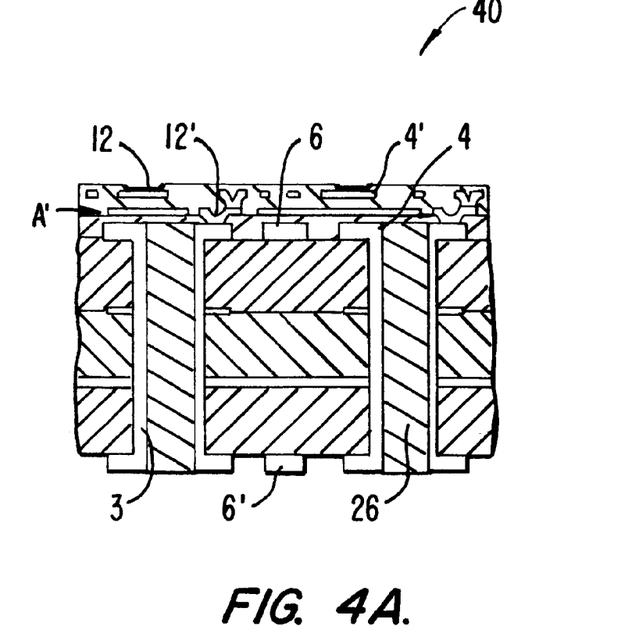
FIG. 4A is a simplified cross-sectional view of two thin film conductive layers formed over a four-layer printed wiring board substrate with the benefit of the present invention.
Figure 4B:
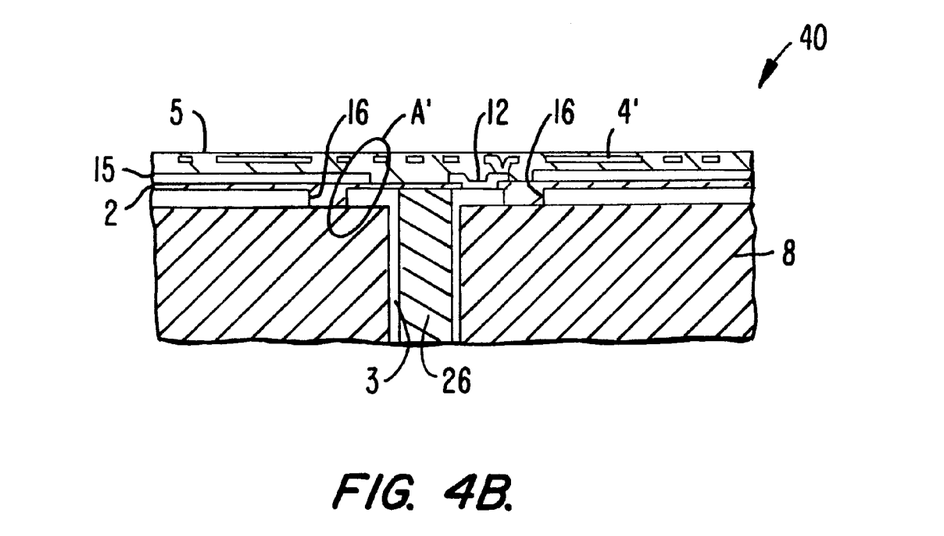
FIG. 4B is a more detailed cross-sectional view of the structure shown in FIG. 3B.

To illustrate the first of these approaches, reference is made to FIGS. 3A and 3B, which show a PWB substrate 30 that does not use the method of the present invention to control stresses, and to FIGS. 4A and 4B, which show a PWB substrate 40 that does use the method of the present invention to control stresses.

FIG. 3A is a cross-sectional view of two deposited thin film conducting layers 4 and 4' formed on the upper surface of a PWB substrate 30, such as substrate 20 shown in FIG. 2, that does not include the structure of the present invention. In FIG. 3A, PWB substrate 30 includes copper clad conductive layers 6 and 6' (about 20 microns thick) on the top and bottom surfaces, respectively, and two internal conductive layers 7 and 7' (about 35 microns thick). The dielectric material 8 is typically an epoxy resin such as NEMA FR4 resin epoxy. A dielectric planarization layer 2 is applied to a thickness of about 10–20 microns over the tops of the raised features 6 on the printed wiring board substrate and may be deposited according to the method disclosed in commonly assigned and concurrently filed U.S. patent application Ser. No. 09/127,580 entitled "AN IMPROVED METHOD OF PLANARIZING THIN FILM LAYERS DEPOSITED OVER A COMMON CIRCUIT BASE," and having David J. Chazan, Ted T. Chen, Todd S. Kaplan, James L. Lykins, Michael P. Skinner and Jan I. Strandberg listed as co-inventors. First metalization layer 4 is deposited over layer 2. The purpose of this first metalization layer 4 is to act as a ground reference plane. A second dielectric layer 5 is coated to a thickness of about 10 microns. The signal metalization layer 4' is then deposited and patterned and a final dielectric layer 5 is deposited over the metal for passivation.

Internal vias 12' in the deposited thin film build-up layers are formed either by wet chemical etch or laser ablation. The signal traces, 4 and 4' in the deposited thin film build-up metalization layers and 6 on the surface of the printed wiring substrate, are formed using pattern mask, photo exposure, and etch steps.

One of the key structural features of FIG. 3A is identified by arrow A. Note that in the region extending vertically above the plated through hole 3 there are no copper features seen until the second metalization layer 4'. The present inventors have discovered that regions such as this are weak points in the dielectric layer that are more susceptible to crack and thus form a failure due to mechanical stresses than other regions.

It is important to note that the features in the drawings are not shown to scale. The metalized features of the deposited thin film build-up layers are far more delicate than the metal features on the surface of the printed wiring substrate 30. In an exemplary application, the metalized features of the deposited thin film build-up layers are in the range of 5 to 10 microns thick, whereas the conductive features on the surface of the printed wiring board are on the order of 20–40 microns thick.

FIG. 3B is a detailed view of the first deposited thin film build-up layer of FIG. 3A. This figure shows that the dimensional differences between the relatively coarse features of the printed wiring board substrate 40, for example the plated through hole 3, and the fine features of the thin film build-up layer 4 leave large areas of dielectric 9 containing no metal conductors. In general, accumulated stresses in the materials are minimum at the temperature at which they are fabricated. Thus during fabrication, for example, when the dielectric is at curing temperature, the conducting material and the dielectric material reach stable physical states. This stability results in a minimum of accumulated stress between the boundaries of the layers in the substrate.

Whenever the temperature of the substrate changes, either from a fabrication process step such as reflow or through operation of a finished device, the conductive materials 1, 3, 4 and 6 tend to expand or contract less than the insulating materials 2 and 5. This occurs since the temperature coefficients of expansion of the conductive material, 15–17 parts per million for copper in an exemplary application, is less than that of the insulating dielectric, 50–70 parts per million in the same exemplary application. When the structure of FIG. 3B is cold and the temperature increases, the conductive material begins to expand at a rate less than the dielectric material. This difference in expansion rates causes stress to accumulate at each boundary between dielectric and conductor. The amount of the accumulated stress is proportional to the difference in the coefficients of expansion times the rate of temperature change.

In FIG. 3B, a typical area of physical stress is shown at region A. Because the underlying feature of the printed wiring substrate 40 is larger dimensionally than the conductor 4 in the deposited thin film layer, the stress tends to focus at this point. If the stress is sufficient, a crack will develop in the dielectric in the area defined by A. Where relatively large aspect ratios of dielectric to metal conductors exists in a deposited thin film layer, for example at area 9 in FIG. 3B, the likelihood of cracking increases. This is due to the lack of strength in the dielectric material with an attendant inability to withstand the stress due to unequal expansion or contraction. Once a crack starts it will propagate upward unless interrupted by some stronger feature. Since the overlying features in the deposited thin film layers are small, a crack can break a signal conductor creating a failure.

This unequal expansion or contraction is present in all high density interconnect technologies, but is more serious in printed wiring board substrates with thin film deposition technology due to the characteristics of the materials used. Wherever two materials with differing temperature coefficients are joined such lateral stresses will exist. The problem becomes one of mitigating, to the greatest extent possible, the deleterious effects of the forces generated.

The substance of the first aspect of the present invention used to combat potential stress failures is depicted in FIG. 4A. In FIG. 4A, a printed wiring board substrate 40 has had the large areas of dielectric (e.g., areas 9 shown in FIG. 3B) filled in with metal features, as indicated by the arrow at A'. This is accomplished by forming a ground plane 15 as the initial thin film metalization layer on substrate 40. Ground plane 15 covers as much real estate over the printed wiring board substrate as possible. In effect, the ground plane creates a mechanical barrier, or shadow over the corners of the coarse surface features (e.g., plated through holes 3 and conductive lines 6) of the printed wiring board substrate. Referring to FIG. 4B, should a crack start at the corner of a course feature such as plated through hole 3 in the area marked A' and propagate upward, it will meet the overlying ground plane 15 and stop.

In a preferred embodiment, ground plane 15 covers almost the entire surface of printed wiring board substrate 40 with the exception of areas where electrical connections between upper and lower conductive layers are made through the ground plane layer. Such connections include metal islands in layer 15 that are not grounded and are instead connected by vias to upper and lower layers. The more coarse feature metal edges that are covered by ground plane layer 15 the better. In a most preferred embodiment, 100% of the coarse feature metal edges are covered by ground plane 15. Typically, though a substrate such as substrate 40 will have 1000 coarse feature metal edges or more. Perhaps significantly more. Leaving just several edges unconvered, or a small percentage of the total edges or the total length of the total edges uncovered, does not mean this aspect of the present invention is not practiced. Some benefits of the present invention can still be obtained if 90%, or more preferably 95% of the total coarse feature metal edges are covered or if 90%, or more preferably 95% of the total length of all coarse feature metal edges (when summed together) is covered. In certain embodiments, ground plane 15 is designed to overlap the edges 16 of the coarse metal features by at least 10–100 microns and even more preferably by at least 25 microns.

Figure 5A:
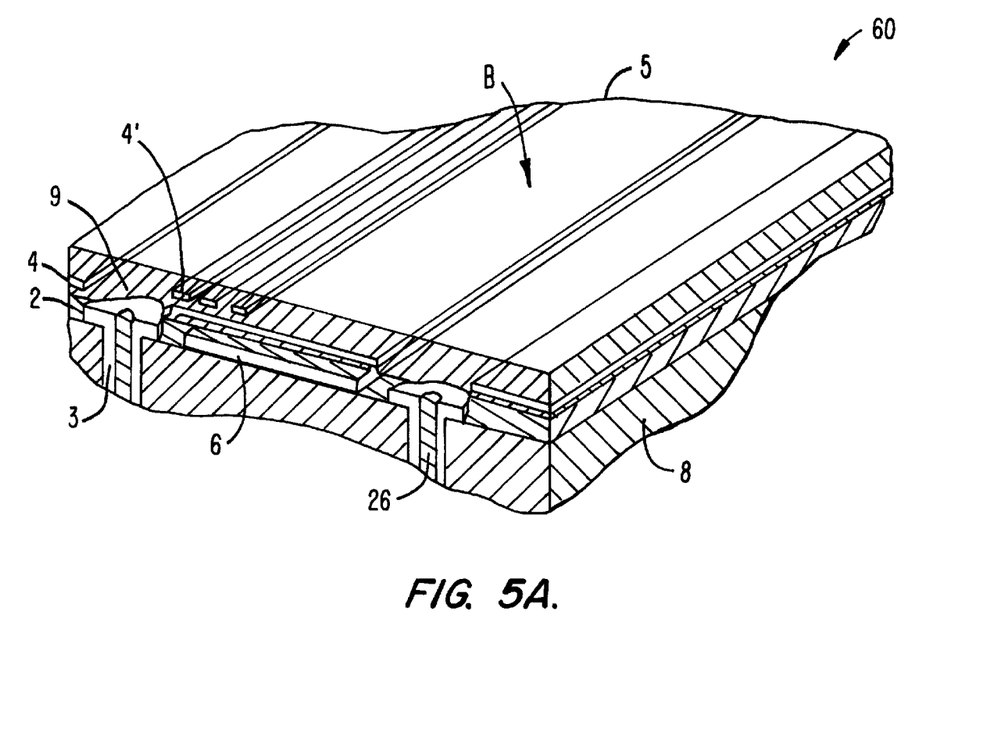
FIGS. 5A and 5B are isometric views of a typical deposited thin film build-up layer structure without the present invention.

FIG. 5A is an isometric view of a section of a high density interconnect structure similar to that shown in FIG. 3A. In FIG. 5A, a printed wiring board substrate 60 has a single deposited thin film build-up layer 4 in the form of a ground plane and a second deposited thin film layer 4' as the signal wiring layer. The arrow B indicates a large area of dielectric material between groups of signal conductors.

Figure 5B:
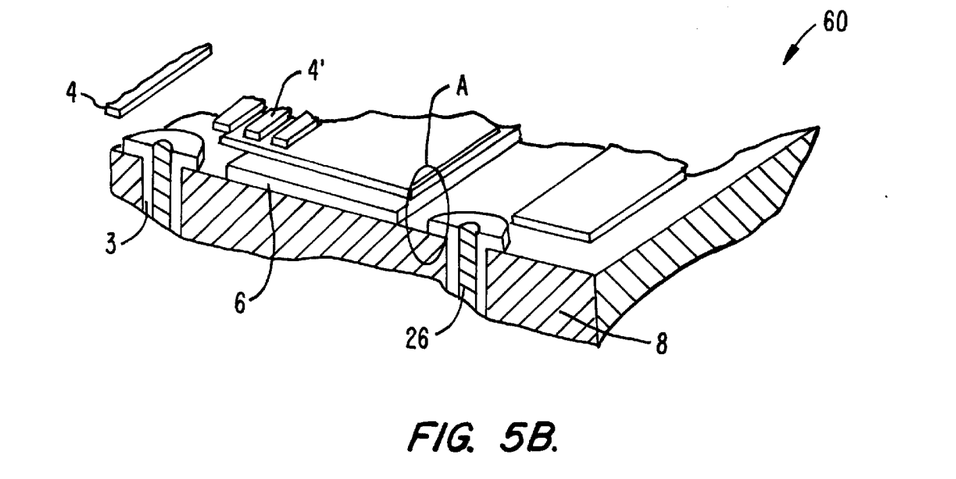

FIG. 5B shows the printed wiring board substrate 60 of FIG. 5A with the thin film dielectric layers stripped away for clarity. In this view an area A, similar to area A in FIGS. 3A and 3B, is highlighted to show the vertical exposure of the coarse feature of the plated through hole 3 to the deposited thin film metalization layer above layer 4. As can be seen, there is no barrier of any sort to prohibit a crack from propagating from the corner of plated through hole 3 to the overlying signal layers 4 or 4'. Thus, even though the substrate in FIG. 5A employs a thin film ground plane as the initial thin film metalization layer, it does not enjoy the benefit of the above-described first aspect of the present invention. Also, in some locations, such as that shown by B in FIG. 5A, large areas of relatively fragile dielectric exist with no copper features. These areas are susceptible to cracks.

Figure 6A:
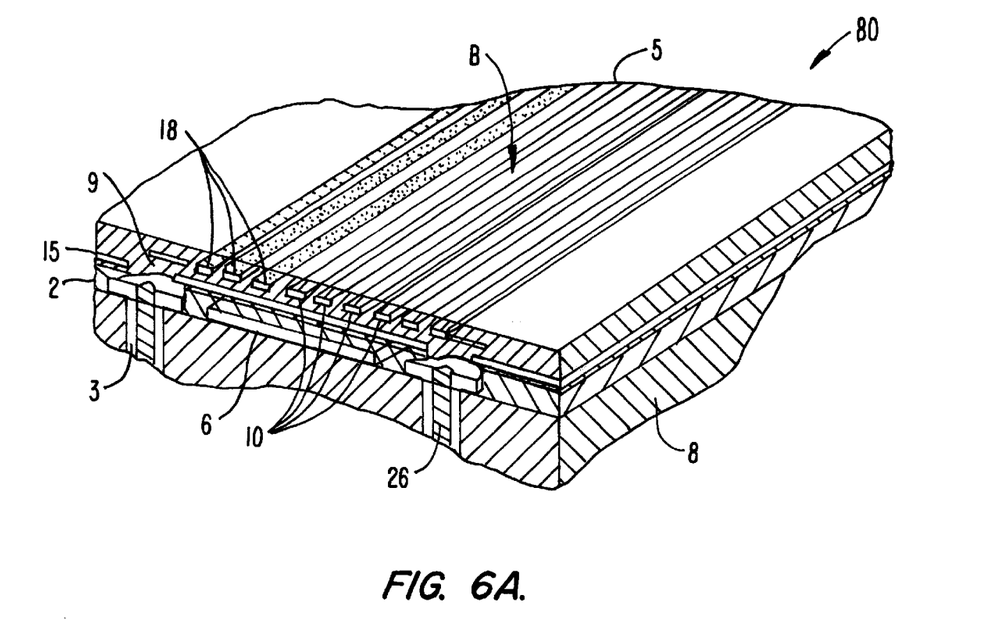
FIGS. 6A and 6B are isometric views of a typical deposited thin film build-up layer structure with the present invention.
Figure 6B:
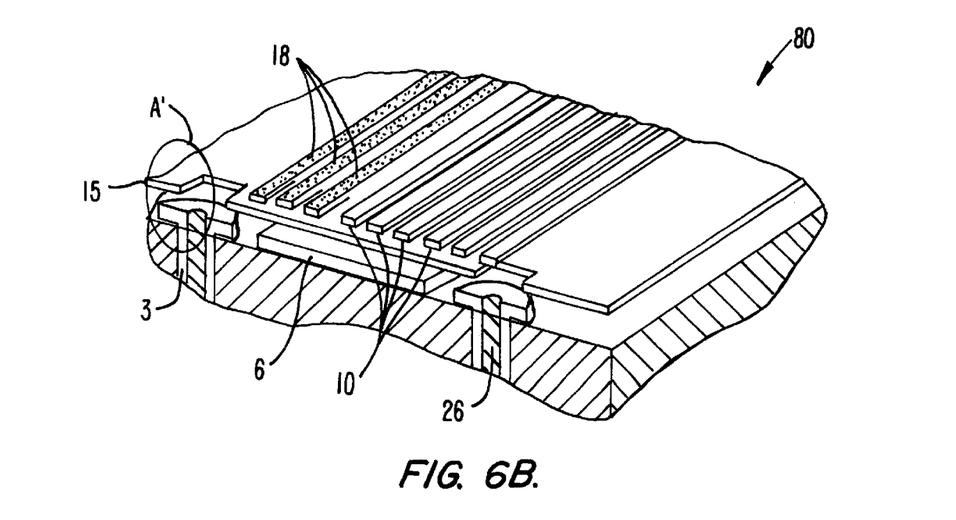

FIGS. 6A and 6B illustrate a further aspect of the present invention designed to prevent cracks in areas such as area B shown in FIG. 5A. FIG. 6B is the same view as FIG. 6A but with the thin film dielectric layers removed to provide greater detail of the overlying metalization features. The signal metalization layer consists of conductors 4' separated by dielectric (5 in FIG. 6A) and can include additional metal layers (not shown) deposited over conducting layer 4'.

The second aspect of the present invention illustrated in FIGS. 6A and 6B is the use of thieving lines in signal layer 4' to reinforce or strengthen the dielectric layer 5. Referring to FIG. 6B, the shaded signal lines 18 are the signal conductors in the second deposited thin film metalization layer. The area B in FIG. 6A is filled with a pattern of metal lines 10 that are not signal lines. These lines are not electrically connected to a circuit and are either left "floating" or are connected to electrical ground. Lines 10 reinforce the surrounding dielectric, in a manner similar to the use of rebar in concrete structures and are referred to as thieving lines because lines 10 were thieved from the copper that would have been removed in the metalization patterning step. Rather than etch away the metal, however, it is left to reinforce the dielectric. As a result of the additional lines 10, the large area of dielectric B in FIG. 6A has been significantly reduced. This line thieving scheme provides additional strength to the dielectric material assisting the material to resist cracking.

The use of thieving lines in itself is not new. For example, such lines are described in U.S. Pat. No. 5,278,727 issued to Scott Westbrook (one of the inventors of the present application) and Gelston Howell. However, in the past thieving lines were used to reduce contraction and expansion of an insulating layer and to provide uniform plating of the copper conductors. In contrast, in the present invention thieving lines 10 are used to reinforce and strengthen the dielectric thereby helping the material resist cracking. The present inventors discovered that it is important to reinforce the dielectric layer in this manner when the dielectric material employed as layer 5 has a relatively low elongation percentage (e.g., less than or equal to about 10%).

The placement of thieving lines 10 can be determined through the use of a computer-aided design (CAD) program as would be understood by a person of ordinary skill in the art and as described in the U.S. Pat No. 5,278,727 patent, which is hereby incorporated by reference in its entirety. Basically, lines 10 are preferably positioned so that they are uniformly spaced apart from each other a distance X that is substantially equal to the distance at which lines 18 are spaced apart from each other. The lines should also be dimensioned and spaced so as to not inductively or capacitively load the signal lines 18 by providing gaps along the length of the lines 10 thereby breaking the lines into smaller segments. In one embodiment, the lines are broken into 1.5 cm segments or smaller.

In operation, as the quiescent temperature changes the individual segments of the conductive and insulating materials exhibit their characteristic reaction. But with the overlapping ground plane as shown in FIG. 6B at A' and thieving lines 10, the mass of the more rapidly expanding dielectric has been reduced and the remaining dielectric has been strengthened by both shadow and rebar effects. The result is that much less of the accumulated stress reaches the delicate overlying deposited thin-film signal layers and the stress is applied over a smaller dielectric area thereby reducing the failures associated with the stress forces.

FIGS. 6A and 6B also illustrate the first aspect of the present invention. For example, as can be seen in FIG. 6A, ground plane 15 covers the edges of coarse features 3 and 6 of the printed wiring substrate 80.

Figure 7:
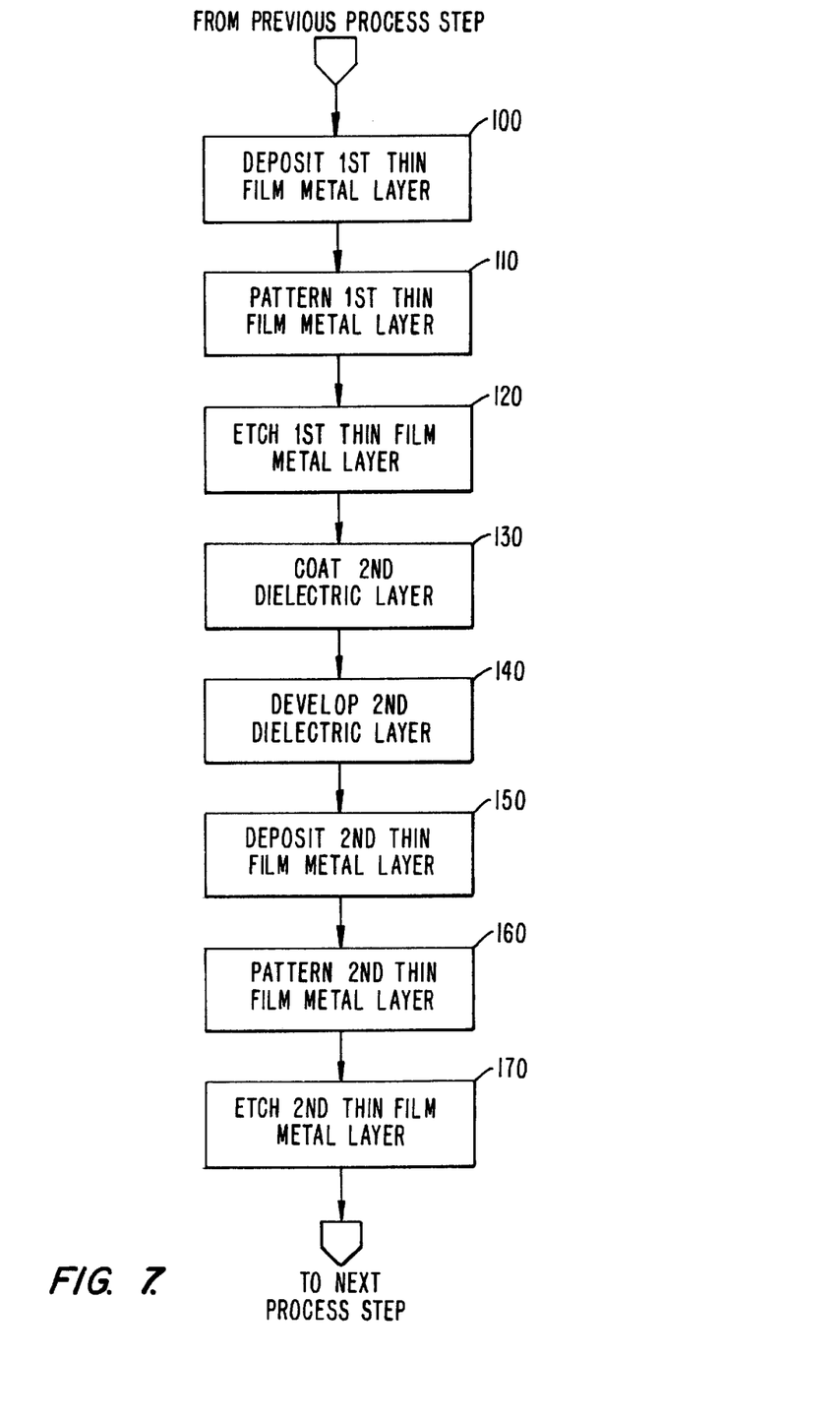
FIG. 7 is a flow chart of the method of the present invention.

FIG. 7 is a flow chart of the method used to implement the present invention. The starting point for the flow chart is a printed wiring board substrate, such as substrate 15 in FIG. 1B having a passivation dielectric layer (e.g., layer 2 in FIG. 2) and vias (e.g., vias 12' in FIG. 2) formed over the substrate. In step 100 the first thin film metalization layer (the grounding plane) is deposited on the entire surface, for example, by sputtering. Preferably, the grounding plane layer is deposited to a thickness of about 2 microns. In step 110 this metalized layer is patterned to create the opening for inner vias, 12' in FIG. 2. In the preferred embodiment, only those areas that require internal vias are etched away in step 120, creating the shadow pattern of the present invention.

Next in step 130, a dielectric layer (e.g., layer 5 in FIG. 2) is formed over the thin film grounding plane and patterned (step 140). As was described in the Background of the Invention above, formation of the dielectric layer can be accomplished by a number of methods, for example, spin coating. A second thin film metalization layer is deposited in step 150 and patterned in step 160 to form signal paths such as conductors 4' shown in FIG. 4A. Part of the patterning of the metalization layer in step 160 is the formation of the thieved lines 10. Again the thin film metalization layer 4' is etched in step 170 yielding both the electrical signal conductors 4' and the reinforcing thieved lines 10. In a preferred embodiment, step 150 includes sputtering a first layer of copper to a thickness of between 2,000–6,000 Å and then pattern plating between 2–10 microns of a second portion of the metal layer after step 160 and 170 as is known to those of skill in the art.

In certain preferred embodiments of the present invention, the PWB substrate is composed of alternating layers of copper 7 and 7', either half or one ounce, and Mitsubishi BT HL810 dielectric 8 laminated into a four layers. The internal layers are power and ground while the bottom major surface serves as a physical fanout interface to a conventional printed wiring board and the top major surface serves as a platform for deposited high density interconnect build-up layers. All of the layers of the printed wiring substrate 35 are connected with plated through holes 3.

The first dielectric build-up layer 2 consists of Ciba Probimer (about 55 microns thick) while the deposited thin film build-up layers are formed using alternating deposited layers of a photo-definable cardo acrylate material such as Nippon Steel Chemical V 259PA dielectric (about 10–12 microns thick) and copper metalization (about 5–10 microns thick). While the example of the present invention shown in the figure has two dielectric and two metalization layers plus a final passivation layer, it can be seen by those skilled in the art that more layers are possible.

Again referring to FIG. 6B, in the preferred embodiment of the present invention the width of the reinforcing lines 10 is between about 15–17 microns while the pitch of the lines is between about 73–77 microns, however, other line/space dimensions may provide adequate strengthening as well. In practice, the width and pitch of the thieved lines should be the same as is used for the signal lines, for example, lines 4' in FIG. 6B.

It can be seen by those skilled in the art that the embodiments described are not the only possible applications of the present invention. Other equivalent or attractive methods of practicing the invention will be apparent to those of ordinary skill in the art after having read the above description of various embodiments of the invention. For example, while the details of the present invention are illustrated with respect to a printed wiring board substrate it is to be understood that the present invention can be used to improve the planarization of the thin film dielectric layers deposited over any common circuit base. As used in this application, a common circuit base is any substrate, daughter board or multichip module upon which chip-level and/or component-level interconnects are formed. Examples of common circuit bases include printed wiring board substrates, silicon substrates, ceramic substrates and aluminum substrates among others. An integrated circuit die, itself, is not a common circuit base. Instead, the bonding pads of the die would typically be connected by a first level interconnection scheme (e.g., wire bonding, tape automated bonding, flip chip bonding, etc.) to a common circuit base that includes power and ground conductors and signal interconnection lines to connect the die to other die and/or support components such as capacitors and resistors. The method of the present invention is useful in the formation of those signal interconnection lines. Thus, it is possible that other methods and constructions would benefit from the present invention and the only limiting factor are the claims given.

What is claimed is:

1. A method for forming a high density interconnect printed wiring board substrate having a first patterned conductive layer formed over an upper surface of the substrate, said first patterned conductive layer including a plurality of conductive lines having edges that define boundaries of said conductive lines, said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines, wherein said thin film conductive layer is patterned such that, after said patterning step, said thin film conductive layer overlies said edges of said conductive lines by at least 10 microns.

2. The method of claim 1 wherein said thin film conductive layer is patterned such that, after said patterning step, said thin film conductive layer overlies said edges of said conductive lines by at least 25 microns.

3. The method of claim 1 wherein said first patterned conductive layer is between 3–10 times as thick as said thin film conductive layer.

4. A method for forming a high density interconnect printed wiring board substrate having a first patterned conductive layer formed over an upper surface of the substrate, said first patterned conductive layer including a plurality of conductive lines having edges that define boundaries of said conductive lines, said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines, wherein said first patterned conductive layer comprises copper clad between about 20–40 microns thick.

5. The method of claim 4 wherein said thin film conductive layer comprises a copper or copper alloy between about 2–8 microns thick.

6. A method according to claim 5 wherein said dielectric layer comprises a photo-definable cardo acrylate material.

7. A method for forming a high density interconnect printed wiring board substrate having a first patterned conductive layer formed over an upper surface of the substrate, said first patterned conductive layer including a plurality of conductive lines having edges that define boundaries of said conductive lines, said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines, wherein said thin film conductive layer is a ground plane layer.

8. A method for forming a high density interconnect printed wiring board substrate having a first patterned conductive layer formed over an upper surface of the substrate, said first patterned conductive layer including a plurality of conductive lines having edges that define boundaries of said conductive lines, said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines;

(c) forming a thin film dielectric layer over said patterned thin film conductive layer;

(d) forming a second thin film conductive layer over said thin film dielectric layer; and (e) patterning said second thin film conductive layer to include a plurality of signal lines and a plurality of thieving lines, said thieving lines begin placed between nonuniformly spaced signal lines to provide a substantially uniform combined pattern of signal lines and thieving lines.

9. A method for forming a high density interconnect printed wiring board substrate having a first patterned conductive layer formed over an upper surface of the substrate, said first patterned conductive layer including a plurality of conductive lines having edges that define boundaries of said conductive lines said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines, wherein at least 95% of all edges of all conductive lines in said first patterned conductive layer are covered by said patterned thin film conductive layer.

10. A method for forming a high density interconnect printed wiring board substrate having a first patterned conductive layer formed over an upper surface of the substrate, said first patterned conductive layer including a plurality of conductive lines having edges that define boundaries of said conductive lines, said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines, wherein 100% of all edges of all conductive lines in said first patterned conductive layer are covered by said patterned thin film conductive layer.

11. A method for forming a high density interconnect printed wiring board substrate having a first patterned conductive layer formed over an upper surface of the substrate, said first patterned conductive layer including a plurality of conductive lines having edges that define boundaries of said conductive lines, said substrate also having a dielectric layer formed over said first patterned conductive layer and between the edges of said conductive lines, said method comprising:

(a) forming a thin film conductive layer over said dielectric layer; and (b) patterning said thin film conductive layer such that after said patterning step said thin film conductive layer overlies said edges of said conductive lines, wherein at least 95% of the total length of all edges of all conductive lines in said first patterned conductive layer is covered by said patterned thin film conductive layer.

12. A method for reducing thermally generated sheer stress cracking at an interface between an edge of a conductive line and insulative layer in a high density interconnect printed wiring board substrate, said method comprising:

(a) forming a patterned thin film conductive layer over said insulating layer such that the patterned conductive layer overlies the edges of said conductive lines thereby forming a mechanical barrier to cracks propagating upward.

13. The method of claim 12 wherein said conductive line is thicker than said thin film conductive layer.

14. The method of claim 13 wherein said conductive line is between 3 and 10 times as thick as said thin film conductive layer.

15. A method for strengthening thin film build-up layers deposited over a high density interconnect common circuit base, said method comprising:

(a) forming a photo-definable thin film dielectric layer over said patterned thin film conductive layer, said thin film dielectric layer having a coefficient of expansion of less than about 10%;

(b) forming a thin film conductive layer over said photo-definable thin film dielectric layer; and (c) patterning said thin film conductive layer to include a plurality of signal lines and a plurality of thieving lines, said thieving lines begin placed between nonuniformly spaced signal lines to provide a substantially uniform combined pattern of signal lines and thieving lines.

16. The method of claim 15 further comprising:

(d) forming a second photo-definable thin film dielectric layer of said patterned thin film conductive layer, said second photo-definable thin film layer having a coefficient of expansion less than about 10%.

17. The method of claim 15 wherein said photo-definable thin film dielectric layer comprises a cardo acrylate material.

18. The method of claim 17 wherein said cardo acrylate material comprises Nippon Chemical Steel V-259PA.

* * * * *